(12) United States Patent
DePaula et al.

(10) Patent No.: US 8,523,071 B2
(45) Date of Patent: Sep. 3, 2013

(54) ELECTRONIC ASSEMBLIES AND METHODS OF FORMING ELECTRONIC ASSEMBLIES

(75) Inventors: Andrew DePaula, Spokane, WA (US); Larry Aamodt, College Place, WA (US); Ronald Vyhmeister, Yucaipa, CA (US)

(73) Assignee: Intellipaper, LLC, Spokane, WA (US)

( * ) Notice: Subject to any disclaimer, the term of this patent is extended or adjusted under 35 U.S.C. 154(b) by 0 days.

(21) Appl. No.: 13/082,367

(22) Filed: Apr. 7, 2011

(65) Prior Publication Data

US 2012/0081868 A1   Apr. 5, 2012

Related U.S. Application Data

(63) Continuation-in-part of application No. 12/604,300, filed on Oct. 22, 2009, now Pat. No. 8,047,443.

(60) Provisional application No. 61/321,774, filed on Apr. 7, 2010.

(51) Int. Cl.
*G06K 7/00* (2006.01)

(52) U.S. Cl.
USPC .......................................... 235/435; 235/492

(58) Field of Classification Search
USPC ................................. 235/435, 492
See application file for complete search history.

(56) References Cited

U.S. PATENT DOCUMENTS

| | | |
|---|---|---|
| D267,009 S | 11/1982 | Doi |
| 4,780,603 A | 10/1988 | Hamada |
| 4,849,617 A | 7/1989 | Ueda |
| 4,850,105 A | 7/1989 | Nakajima et al. |
| 5,004,899 A | 4/1991 | Ueda |
| D320,225 S | 9/1991 | Ido et al. |
| 5,710,421 A | 1/1998 | Kokubu |
| 5,818,030 A | 10/1998 | Reyes |
| 5,888,624 A | 3/1999 | Haghiri et al. |
| 6,097,605 A | 8/2000 | Klatt et al. |
| 6,109,939 A | 8/2000 | Kondo et al. |
| 6,333,854 B1 | 12/2001 | Sasaoka et al. |
| D452,865 S | 1/2002 | Wallace et al. |
| 6,341,728 B1 | 1/2002 | Kondo et al. |
| D458,935 S | 6/2002 | Hiroki |
| 6,480,390 B2 | 11/2002 | Matsumiya et al. |

(Continued)

FOREIGN PATENT DOCUMENTS

| | | |
|---|---|---|
| DE | 19601358 | 7/1996 |
| EP | 1798732 A1 | 6/2007 |

(Continued)

OTHER PUBLICATIONS

Sony Press Release; "TOPPAN and Sony Successfully Develop 25GB Paper Disc"; Apr. 15, 2004; www.sony.net/SonyInfo/News/Press_Archive/2004/04-15E/; 2pp.

(Continued)

*Primary Examiner* — Kristy A Haupt
(74) *Attorney, Agent, or Firm* — Wells St. John P.S.

(57) ABSTRACT

An electronic assembly includes an electronic device having high-resolution features and at least one conductive contact pad. The electronic assembly further includes a substrate supporting the electronic device and an electrical connection having low-resolution features. The electrical connection extends from the at least one conductive contact pad to a position upon the substrate.

4 Claims, 4 Drawing Sheets

(56) References Cited

U.S. PATENT DOCUMENTS

| | | |
|---|---|---|
| 6,531,775 B1 | 3/2003 | Kobayashi et al. |
| 6,547,151 B1 * | 4/2003 | Baldi .......................... 235/492 |
| 6,567,273 B1 | 5/2003 | Liu et al. |
| 6,580,615 B1 | 6/2003 | Nakanishi et al. |
| 6,665,201 B1 | 12/2003 | Spencer et al. |
| D487,458 S | 3/2004 | Gentil et al. |
| 6,699,053 B2 | 3/2004 | Kuroda |
| 6,700,788 B2 | 3/2004 | Matsushita et al. |
| 6,735,656 B2 | 5/2004 | Hanke et al. |
| D490,814 S | 6/2004 | Kim |
| 6,744,634 B2 | 6/2004 | Yen |
| 6,773,280 B2 | 8/2004 | Sasaki et al. |
| 6,783,060 B2 | 8/2004 | Marappan |
| 6,808,424 B2 | 10/2004 | Kaneshiro et al. |
| 6,824,066 B2 | 11/2004 | Weyant |
| 6,858,925 B2 | 2/2005 | Wada et al. |
| 6,865,086 B2 | 3/2005 | Gochnour et al. |
| 6,900,988 B2 | 5/2005 | Yen |
| 6,908,038 B1 | 6/2005 | Le |
| 6,970,359 B2 | 11/2005 | Gochnour et al. |
| 6,994,263 B2 | 2/2006 | Ueda et al. |
| 7,004,794 B2 | 2/2006 | Wang et al. |
| D518,483 S | 4/2006 | Yu et al. |
| 7,025,623 B2 | 4/2006 | Katsumata et al. |
| 7,040,919 B2 | 5/2006 | Yao |
| 7,083,107 B2 | 8/2006 | Sakamoto et al. |
| 7,102,891 B1 | 9/2006 | Miks et al. |
| 7,104,809 B1 | 9/2006 | Huang |
| D532,788 S | 11/2006 | Cuellar et al. |
| D542,797 S | 5/2007 | Cuellar et al. |
| 7,218,528 B2 | 5/2007 | Chen |
| D545,311 S | 6/2007 | Wai |
| 7,233,499 B2 | 6/2007 | Yu et al. |
| 7,269,004 B1 | 9/2007 | Ni et al. |
| D553,130 S | 10/2007 | Fiorentino et al. |
| 7,334,725 B2 | 2/2008 | Dan |
| 7,340,540 B2 | 3/2008 | Miller et al. |
| 7,344,072 B2 | 3/2008 | Gonzalez et al. |
| D565,572 S | 4/2008 | Yang |
| 7,355,860 B2 | 4/2008 | Miller et al. |
| 7,357,655 B1 | 4/2008 | Van der Steen |
| 7,364,090 B2 | 4/2008 | Cuellar et al. |
| 7,377,448 B2 * | 5/2008 | Dan et al. .................... 235/492 |
| 7,392,358 B2 | 6/2008 | Chen et al. |
| 7,434,739 B2 | 10/2008 | Matsuura et al. |
| D591,753 S | 5/2009 | Nakano et al. |
| 7,537,169 B2 | 5/2009 | Gonzalez et al. |
| D612,385 S | 3/2010 | Aoki |
| 7,721,956 B2 | 5/2010 | Williams et al. |
| 2002/0036236 A1 | 3/2002 | Kondo et al. |
| 2002/0074415 A1 | 6/2002 | Kondo et al. |
| 2002/0084332 A1 | 7/2002 | Kondo et al. |
| 2002/0116668 A1 | 8/2002 | Chhor et al. |
| 2003/0081388 A1 | 5/2003 | Yang |
| 2003/0109179 A1 | 6/2003 | Kaneshiro et al. |
| 2004/0070952 A1 | 4/2004 | Higuchi et al. |
| 2004/0087213 A1 | 5/2004 | Kao |
| 2004/0089717 A1 | 5/2004 | Harari et al. |
| 2004/0089724 A1 | 5/2004 | Lasch et al. |
| 2004/0188531 A1 | 9/2004 | Gengel et al. |
| 2005/0077164 A1 | 4/2005 | Dhers |
| 2006/0098485 A1 | 5/2006 | Leenders et al. |
| 2006/0118639 A1 | 6/2006 | Kean et al. |
| 2006/0154525 A1 | 7/2006 | Bychkov et al. |
| 2006/0180674 A1 | 8/2006 | Margalit et al. |
| 2006/0181716 A1 | 8/2006 | Hoshina |
| 2006/0255158 A1 | 11/2006 | Margalit et al. |
| 2006/0273154 A1 | 12/2006 | Dan |
| 2006/0278723 A1 | 12/2006 | Dan et al. |
| 2006/0288169 A1 | 12/2006 | Steiner |
| 2007/0028046 A1 | 2/2007 | Pham |
| 2007/0099511 A1 | 5/2007 | Miller et al. |
| 2007/0153565 A1 | 7/2007 | Nomura et al. |
| 2007/0243769 A1 | 10/2007 | Atsmon et al. |
| 2007/0252010 A1 | 11/2007 | Gonzalez et al. |
| 2008/0087731 A1 | 4/2008 | Gonzalez et al. |
| 2008/0109309 A1 | 5/2008 | Landau et al. |
| 2008/0224320 A1 | 9/2008 | Palmade et al. |
| 2008/0239406 A1 | 10/2008 | Nakano |
| 2008/0294991 A1 | 11/2008 | Wong et al. |
| 2008/0299788 A1 | 12/2008 | Balchaytis |
| 2009/0009829 A1 | 1/2009 | Katsuyama |
| 2009/0014522 A1 | 1/2009 | Harris et al. |
| 2009/0063755 A1 | 3/2009 | Perng et al. |
| 2010/0218021 A1 | 8/2010 | Ma et al. |
| 2010/0289844 A1 | 11/2010 | Seibt |

FOREIGN PATENT DOCUMENTS

| | | |
|---|---|---|
| EP | 098227309 | 5/2012 |
| WO | WO 2005/124932 A2 | 12/2005 |
| WO | WO 2008/020442 | 2/2008 |
| WO | WO 2008/036537 | 3/2008 |
| WO | PCT/US2009/061725 | 6/2010 |
| WO | PCT/US2009/061725 | 4/2011 |
| WO | PCT/US2011/031432 | 12/2011 |
| WO | PCT/US2011/031473 | 12/2011 |
| WO | PCT/US2011/031645 | 12/2011 |
| WO | PCT/US2011/031646 | 12/2011 |

OTHER PUBLICATIONS

Website—www.minicdwizard; 2000; 1 p.
"Unversal Serial Bus Specification Revision 2.0"; Figure 6.9; pp. 99; Feb. 1998.
WO PCT/US2011/031432 IPRP, Oct. 9, 2012, IntelliPaper, LLC.
WO PCT/US2011/031432 SR, Dec. 15, 2011, IntelliPaper, LLC.
WO PCT/US2011/031473 IPRP, Oct. 9, 2012, IntelliPaper, LLC.
WO PCT/US2011/031473 SR, Dec. 16, 2011, IntelliPaper, LLC.
WO PCT/US2011/031645 IPRP, Oct. 9, 2012, IntelliPaper, LLC.
WO PCT/US2011/031645 SR, Dec. 14, 2011, IntelliPaper, LLC.
WO PCT/US2011/031646 IPRP, Oct. 9, 2012, IntelliPaper, LLC.
WO PCT/US2011/031646 SR, Dec. 20, 2011, Intellipaper, LLC.

* cited by examiner

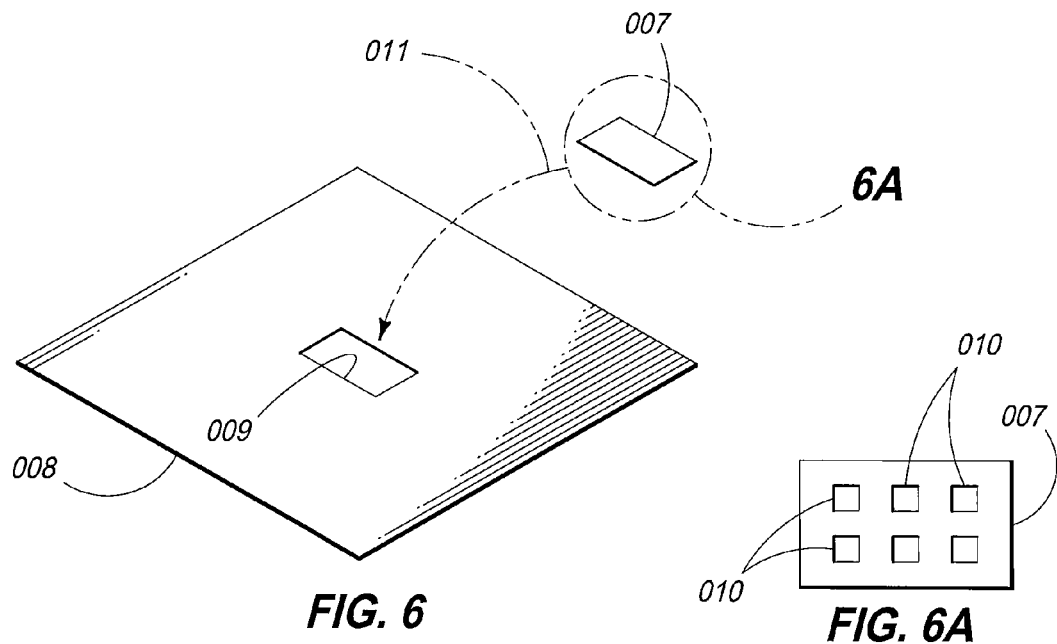
FIG. 6
FIG. 6A
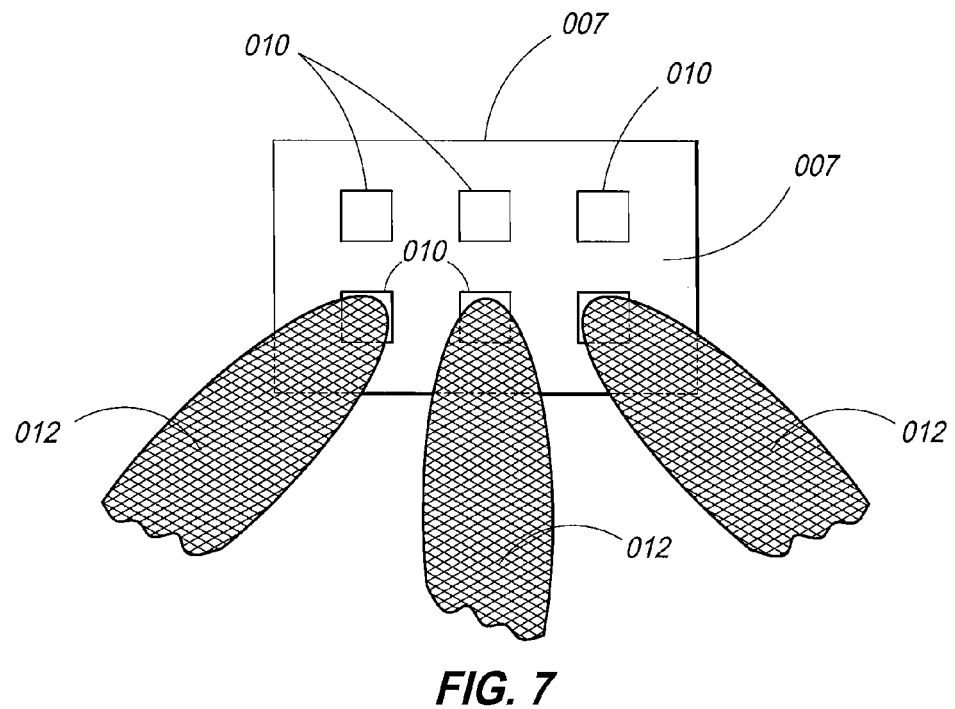
FIG. 7

ELECTRONIC ASSEMBLIES AND METHODS OF FORMING ELECTRONIC ASSEMBLIES

RELATED PATENT DATA

This application claims the benefit of U.S. Provisional Patent Application Ser. No. 61/321,774 filed Apr. 7, 2010, the entire disclosure of which is incorporated herein by reference. This application is a continuation in part of U.S. patent application Ser. No. 12/604,300 filed Oct. 22, 2009, now U.S. Pat. No. 8,047,443 which is also incorporated herein by reference.

TECHNICAL FIELD

The present disclosure, in various embodiments, relates to electronic assemblies and methods of forming electronic assemblies.

BACKGROUND OF THE INVENTION

Historically, integrated circuits, for example silicon chips, have been connected to, or interfaced with, the outside world (outside circuitry and/or electronic components) in a variety of ways. Typically, the circuitry on an integrated circuit is connected to a number of metalized pads on the surface of the integrated circuit. Those pads are then connected to the outside circuitry or components by a variety of methods. Some methods involve connecting these pads to the pins of the package carrying the integrated circuit with fine wires. Other methods involve forming bumps on these pads with solder or a conductive polymer. Once the bumps are formed, the integrated circuit chip may be flipped over and directly bonded to a substrate, as in a Flip Chip process. All of these methods provide for the connection of integrated circuitry to the outside world. However, solutions have yet to be developed for connecting pads of a semiconductor chips to other objects.

BRIEF DESCRIPTION OF THE DRAWINGS

Preferred embodiments of the disclosure are described below with reference to the following accompanying drawings.

FIG. 6 illustrates an exploded perspective view of an electronic assembly in accordance with an embodiment.

FIG. 6A illustrates a top view of circuitry in accordance with an embodiment.

FIG. 7 illustrates a fragmentary top view of an electronic assembly in accordance with an embodiment.

DETAILED DESCRIPTION OF THE PREFERRED EMBODIMENTS

Various embodiments of the invention disclosed herein are directed to electronic assemblies and methods for connecting circuitry to readily available and inexpensive substrates such as paper media. Such connectivity methods were not available prior to the invention disclosed herein because of the incompatibility of feature sizes and resolutions between standard printing techniques and circuit manufacturing techniques. The inventions disclosed herein allow for the use of a low-resolution method, such as printing, to configure inherently high-resolution devices, such as semiconductor chips or integrated circuits, for subsequent electrical connection to other (outside) circuitry and components. Stated another way, the invention disclosed herein allows for interfacing printed electronics with high-resolution integrated circuitry.

Figure 1:
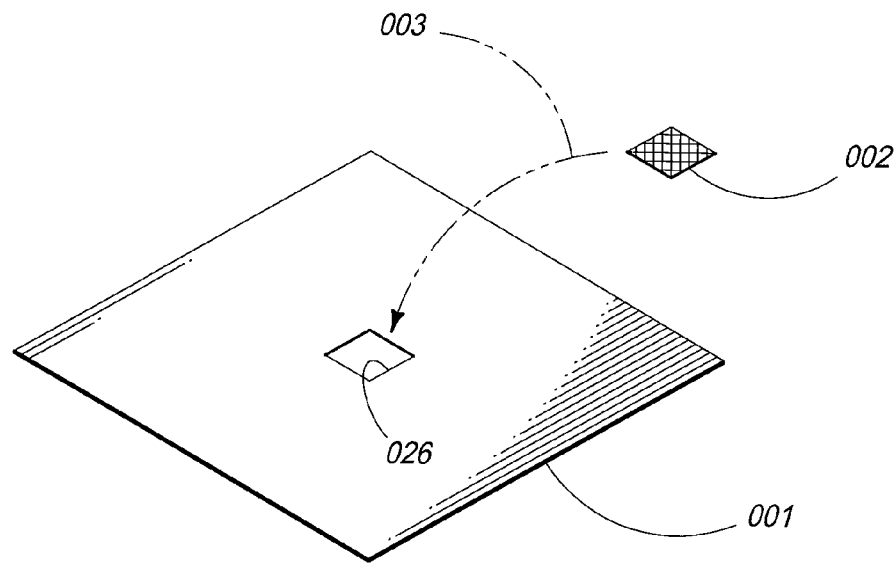
FIG. 1 illustrates a perspective view of a substrate and circuitry in accordance with an embodiment.

Referring to FIG. 1, a method of using inexpensive and readily available substrate 001 of a specific thickness, and circuitry 002 having a similar thickness to form an assembly. Substrate 001 may comprise paper, cardboard, synthetic paper, plastic film, plastic, and/or other thin, flexible materials that can be processed by printing devices (e.g., printers). Substrate 001 may be laminar structure and may be in the form of a sheet. In one embodiment, circuitry 002 includes electronic devices having high-resolution features measured on an order of magnitude of nanometers, such as semiconductor chips and integrated circuits.

Still referring to FIG. 1, circuitry 002 includes at least one surface finished with at least one electrical connection point or conductive contact pad sufficiently large to accommodate the resolution of the printing techniques described herein. In one embodiment, circuitry 002 may have opposite surfaces (upper and lower surfaces) finished with contact pads sufficiently large to accommodate the resolution of the printing techniques described herein. The pads of circuitry 002 may have dimension much larger than those typically found in standard integrated circuitry (IC) technology. For example, the pads may have a surface area of about ten to about thirty times the surface area of a conventional IC pad. These pads may be formed in the integrated circuitry finishing process and might not have any appreciable increase in thickness relative to the thickness of the original (or bare) silicon die or chip.

Still referring to FIG. 1, an opening (or cut-out region) such as a void 026 is formed in substrate 001. In one embodiment void 026 is configured to have the same shape and the same size as circuitry 002 such that circuitry 002 fit in void 026. Alternatively, void 026 may be slightly larger than circuitry 002. Although a square void is illustrated, other voids may be formed to match a shape of circuitry 002 and may be large enough to accommodate the circuitry 002.

Figure 2:
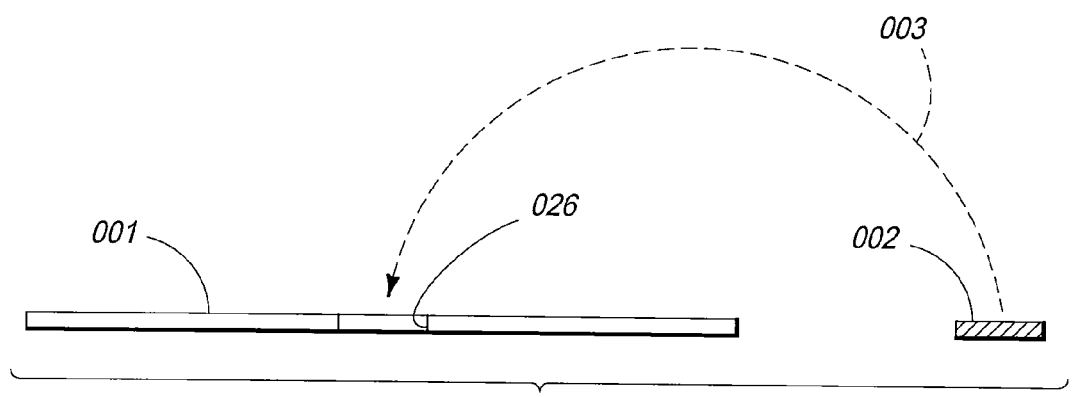
FIG. 2 illustrates a side view of a substrate and circuitry in accordance with an embodiment.

Still referring to FIG. 1 and referring to FIG. 2, circuitry 002 is positioned in void 026 as indicated by direction arrow 003. Circuitry 002 may be affixed (e.g., bonded or secured) to substrate 001 when positioned in void 026, for example with an adhesive. It should be understood that the adhesive bonds circuitry 002 to substrate 001 without covering the one or more electrical pads on the upper surface of circuitry 002.

Figure 3:
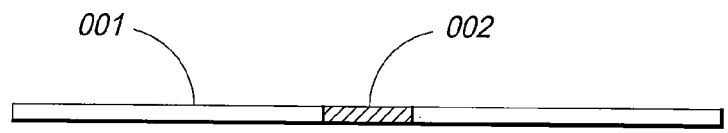
FIG. 3 illustrates a side view of an electronic assembly in accordance with an embodiment.

Still referring to FIGS. 1 and 2, and referring to FIG. 3, another aspect of the invention includes affixing circuitry 002 to substrate 001 so that at least one surface of circuitry 002 is coplanar with (or flush with) at least one surface of substrate 001. Alternatively, both upper and lower surfaces of the circuitry 002 may be coplanar with (or flush with) respective opposite surfaces of substrate 001.

Figure 4:
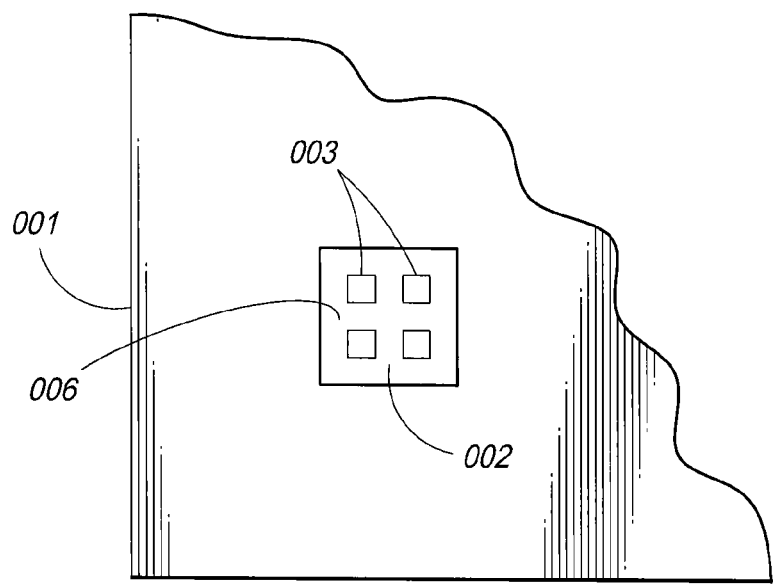
FIG. 4 illustrates a fragmentary top view of an electronic assembly in accordance with an embodiment.

Referring to FIG. 4, circuitry 002 is shown secured in void 026 (see FIGS. 1-3) and circuitry 002 is shown with four conductive pads 003 provided on an upper surface 006 of chip 002. Conductive pads 003 may have a surface area of about ten to about thirty times the surface area of conventional IC pads.

Figure 5:
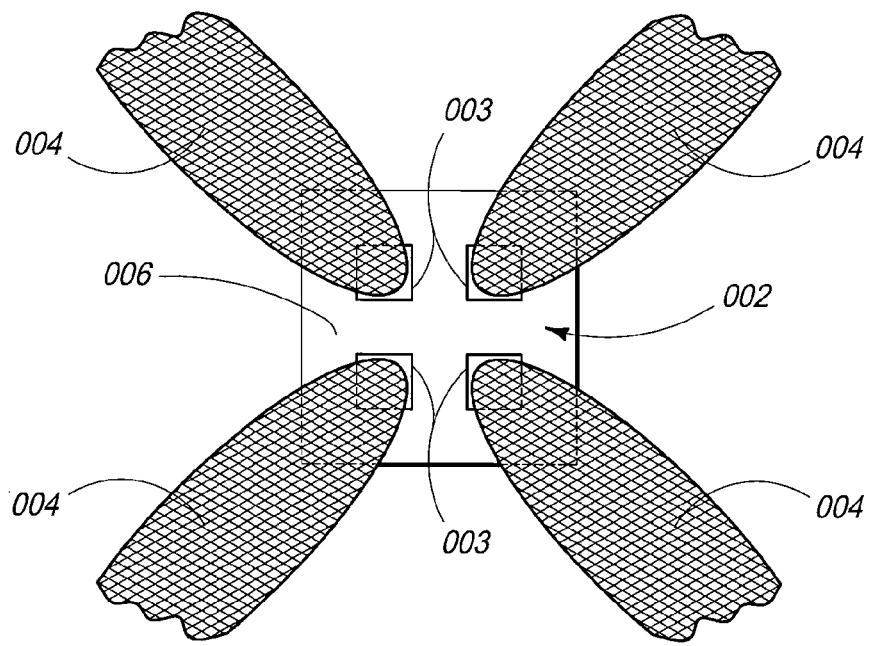
FIG. 5 illustrates a fragmentary top view of an electronic assembly in accordance with an embodiment.

Referring to FIG. 5, electrically conductive traces 004 are printed over portion of pads 003, over a portion of the upper surface 006 of circuitry 002, and over a portion of substrate 001. In one embodiment, traces 004 comprise electrically conductive ink. The printing of traces 004 may be performed by any suitable printing device and any compatible printing process such as inkjet, silkscreen or stamping. Traces 004 may cure (e.g., dry) to form a plurality of discrete electrical interconnections extending between pad 003 and a position on substrate 001 (not shown). As used herein, the term ink includes a variety of different substances used to form a desired pattern on a substrate, for example, liquid inks that cure by drying, pastes and powders deposited in a desired location electrostatically (e.g., toner) and then heat cured/fused onto a surface of a substrate, thereby making a continuous conductive layer. Other example include inks flash cured with high intensity bursts of light, which effectively raise the surface temperature of the ink to 1000 degrees or more instantaneously sintering metallic particles of the ink into a contiguous metallic surface. The term cure is used herein to refer to the process an ink goes through from the time first deposited on the substrate until the ink reaches a semi-permanent state. Examples of curing include drying, heating, fusing, and exposure to light. In addition or as an alternative, the invention may employ other inks and their respective curing processes not specifically described above.

Referring to FIG. 5, in one embodiment, each trace 004 has a terminal end at the position on substrate 001 that form another conductive contact pad (not shown) for subsequent electrical connection to the outside world via electrical (e.g., ohmic) connection to another electronic device or component. That is, each trace 004 may establish an electrical connection between circuitry 002 and additional circuitry (not shown) via the conductive contact pad formed on substrate 001. In one embodiment, the conductive contact pads formed on substrate 001 are formed in a standard Universal Serial Bus (USB) configuration having widths and lengths specified by the USB standard and being spaced apart from each other according to the USB standard. In the embodiment, the conductive contact pads formed on substrate 001 may be physically connected to a USB port of a computer and may therefore be electrically and ohmically connected to the USB port of the computer.

Still referring to FIG. 5, it should be understood that the transition between circuitry 002 and substrate 001 establishes an interface and that traces 004 cross the interface. Each of traces 004 may function differently dependent on the pad of circuitry 002 to which the trace is connected. For example, one trace may be configured to transmit data while another trace may be configured to receive data.

Referring to FIGS. 6 and 6A, another embodiment of an assembly is illustrated including a substrate 008 of a specific thickness and circuitry 007 having a similar thickness. In this embodiment, circuitry 007 may comprise circuitry printed on a laminar substrate, such as laminated paper. Substrate 008 may be a laminar carrier such as paper of similar overall thickness as a thickness of circuitry 007. Substrate 008 includes an opening 009 (void or cut-out region) substantially the same size as the circuitry 007. Circuitry 007 is finished on at least one surface with connection pads 010 as shown.

Still referring to FIGS. 6 and 6A, circuitry 007 may be moved along direction 011 and placed in opening 009 of substrate 008 and may be attached to substrate 008. Moreover, circuitry 007 may be positioned with its outermost surfaces in a coplanar relationship with respective outermost surfaces of the substrate 008.

Any compatible printing process may be used to apply conductive ink 012 to a top surface of circuitry 007, including conductive pads 010, and carrier 008. Each ink trace 012 may cover a portion of the circuitry 007, forming an electrical connection to a given pad 010 and crossing the interface between circuitry 007 and substrate 008 and across substrate 008 thus providing the opportunity to connect circuitry 007 with other circuitry and/or the outside world.

The exemplary electronic assemblies described herein may include various other aspects as further described in U.S. patent application Ser. No. 12/604,300, which is incorporated herein by reference.

The various inventions disclosed in this document are advantageous since circuitry produced with techniques having a very high resolution and very small feature sizes (measured in nanometers typically) may be inexpensively electrically connected with other electronic circuitry via electrically conductive traces formed using printing techniques, resolutions, and feature sizes, that are one or more orders of magnitude larger than those used in the circuitry.

It is also noteworthy that the electrically conductive ink used may be printed on a varying topography inherent in substrate 008 or substrate 001. The varying topography may be due to paper content of the substrates, a difference in height between substrate 001 and circuitry 002, a difference in height between substrate 008 and circuitry 007, a gap at the interface between substrate 001 and circuitry 002, and/or or a gap at the interface between carrier 008 and printed circuit 007.

Figure 8:
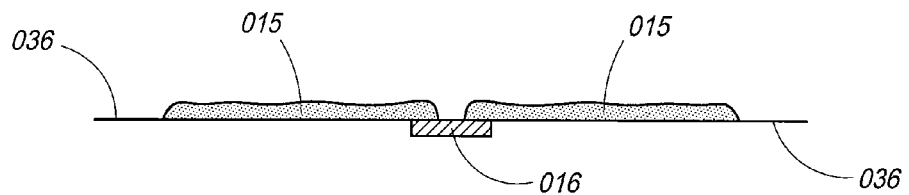
FIG. 8 illustrates a side view of an electronic assembly in accordance with an embodiment.

Referring to FIG. 8, the thickness and makeup of traces 015 may be selected so that once printed on the varying topography which includes the interface between circuitry 016 and substrate 036, the electrically conductive traces 015 serves as a reliable electrical conductor despite the varying topography. The traces 015 may be deposited on the varying topography using conventional print methods such that when initially deposited, the traces 015 comprise uncuredelectrically conductive ink able to conform to the varying topography. Furthermore, a surface tension of the uncuredink may prevent the ink from flowing away from the varying topography and thereby not remaining conformal with the varying topography. As the ink cures, it may remain conformal with the varying topography, thereby forming a reliable electrical connection to, for example, a pad such as pad 003 of FIGS. 1-5 or pad 010 of FIGS. 6-7.

Normal printing tolerances and resolutions used in printing text and/or graphics on paper are acceptable, since traces 015 just need to make reliable electrical contact with some portion of the oversized pad on the surface of circuitry 016 without touching another pad of circuitry 016.

Figure 9:
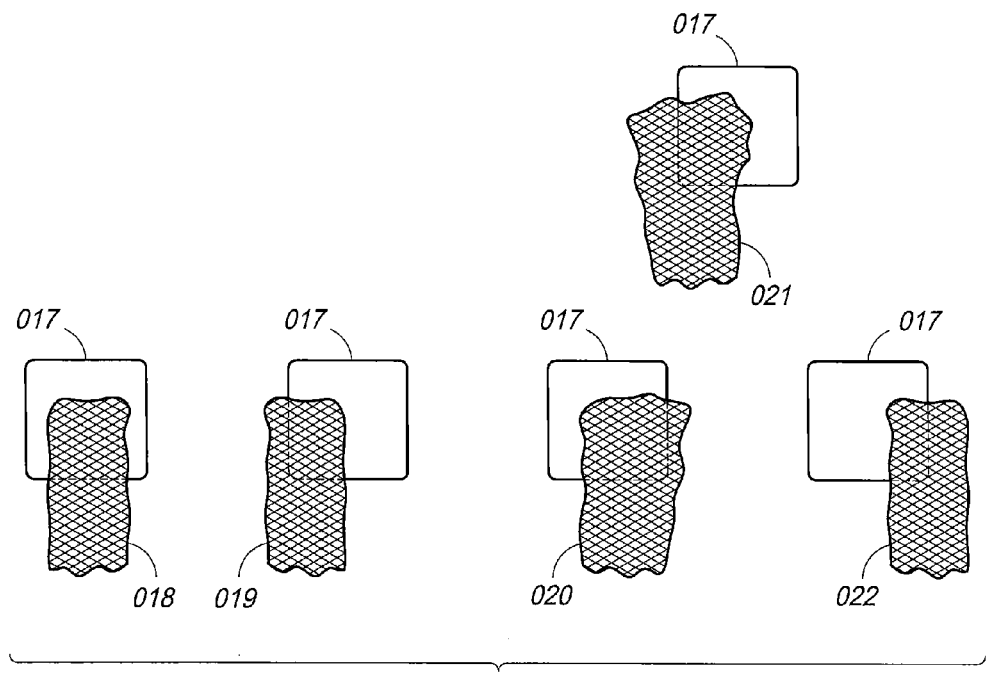
FIG. 9 illustrates different top views of electronic assemblies in accordance with an embodiment.

Referring to FIG. 9, tolerances and resolutions of a printing process used to deposit the conductive ink forming the traces may be taken into account when designing conductive traces. For example, in one design, trace 018 may be centered within a width of pad 017. In actual implementation, however, the trace may be printed to the left of center as illustrated by actual trace 019 and actual trace 021 despite the design because the tolerances of the printing process may not be precise enough to deposit the trace in the center of the pad. Similarly, an actual trace based on designed trace 018 may be to the right of center, as illustrated by actual traces 021 and 022, and might not have the same rectangular shape as designed trace 018 due to the relatively crude tolerances of the printing process.

Still referring to FIG. 9, note that actual traces 019, 020, 021, and 022 may all provide adequate electrical connectivity to pad 017 despite their varying shapes and may all be electrically insulated from pads adjacent to pad 017 due to the fact that they do not make physical contact with the adjacent pads.

Despite the relatively crude tolerances of the printing process, the tolerances of the printing process are known and can be relied on in designing trace widths and spacing between adjacent pads. Accordingly, adjacent pads can be spaced from each other such that when a trace of a given width connecting to one pad is printed, the trace does not make electrical contact with an adjacent pad. Furthermore, traces widths can be designed such that when taking printing process tolerances into account, actual traces based on the design will have adequate width to remain electrically conductive without shorts.

A variety of electrically conductive inks may be used including DuPont's silver-based ink 4929N, DuPont's carbon-based ink 7105, Vorbeck Materials' nanoparticle-based Vor-ink, or Applied Nanotech Holdings Inc. copper-based conductive ink. Other electrically conductive inks may additionally or alternatively be used.

In compliance with the statute, the invention has been described in language more or less specific as to structural and methodical features. It is to be understood, however, that the invention is not limited to the specific features shown and described, since the means herein disclosed comprise various forms of putting the invention into effect. The invention is, therefore, claimed in any of its forms or modifications within the proper scope of the appended claims appropriately interpreted in accordance with the doctrine of equivalents.

The invention claimed is:

1. An electronic assembly comprising:
   a substrate, wherein the substrate comprises laminated paper having opposite sides;
   an electronic circuitry module secured to the substrate and comprising at least one conductive contact pad, wherein the electronic circuitry module comprises integrated circuitry having opposite sides substantially coplanar with the opposite sides of the laminated paper; and
   conductive ink electrically connecting the at least one conductive contact pad with a location on the substrate wherein at the location, the conductive ink is configured for ohmic connection with additional circuitry.

2. The assembly of claim 1 wherein the additional circuitry comprises a USB port in a computer, and wherein the conductive ink forms another conductive contact pad at the location on the substrate, and wherein the another conductive contact pad is electrically coupled to the USB port.

3. The assembly of claim 1 wherein the at least one conductive contact pad comprises a plurality of conductive contact pads, and wherein the conductive ink comprises a plurality of discrete conductive traces, each trace contacting one conductive contact pad.

4. The assembly of claim 1 wherein the substrate comprises paper having a first thickness and wherein the electronic circuitry module comprises a silicon chip having a second thickness substantially the same as the first thickness.

\* \* \* \* \*

UNITED STATES PATENT AND TRADEMARK OFFICE
CERTIFICATE OF CORRECTION

PATENT NO. : 8,523,071 B2  
APPLICATION NO. : 13/082367  
DATED : September 3, 2013  
INVENTOR(S) : Andrew DePaula, Larry Aamodt and Ronald Vyhmeister Page 1 of 1

It is certified that error appears in the above-identified patent and that said Letters Patent is hereby corrected as shown below:

Title Page 2, item (56), References Cited, Other Publications – Replace "Unversal Serial Bus Specification Revision 2.0; Figure 6.9; pp. 99; Feb. 1998." with --Universal Serial Bus Specification Revision 2.0; Figure 6.9; pp. 99; Feb. 1998.--

In the Specification

Column 2, line 32 – Replace "dimension" with --dimensions--

Column 3, line 16 – Replace "example" with --examples--

Column 4, line 27 – Replace "and/or or a" with --and/or a--

Signed and Sealed this  
Twentieth Day of May, 2014

Michelle K. Lee  
*Deputy Director of the United States Patent and Trademark Office*